(12) United States Patent
Schertler (10) Patent No.: US 6,818,108 B2
(45) Date of Patent: Nov. 16, 2004

(54) CHAMBER FOR THE TRANSPORT OF WORKPIECES IN A VACUUM ATMOSPHERE, A CHAMBER COMBINATION AND A METHOD FOR TRANSPORTING A WORKPIECE

(75) Inventor: Roman Schertler, Wolfurt (AT)

(73) Assignee: Unaxis Balzers Aktiengesellschaft, Fuerstentum (LI)

( * ) Notice: Subject to any disclaimer, the term of this patent is extended or adjusted under 35 U.S.C. 154(b) by 65 days.

(21) Appl. No.: 09/905,913

(22) Filed: Jul. 17, 2001

(65) Prior Publication Data

US 2003/0106789 A1 Jun. 12, 2003

Related U.S. Application Data

(63) Continuation of application No. 09/621,734, filed on Jul. 21, 2000, now abandoned, which is a continuation of application No. 08/131,640, filed on Oct. 5, 1993, now abandoned.

(30) Foreign Application Priority Data

Oct. 6, 1992 (CH) .............................................. 3121/92

(51) Int. Cl.⁷ .......................... C23C 14/34; C23C 16/00; H01L 21/306
(52) U.S. Cl. ............................. 204/298.25; 204/298.15; 204/298.23; 204/298.27; 204/298.28; 204/298.35; 118/719; 118/729; 118/730; 156/345.31; 156/345.32; 414/217; 414/222.01; 414/222.03; 414/222.07; 414/222.1; 414/222.11; 414/222.12; 414/223.01; 414/226.01; 414/226.02
(58) Field of Search ...................... 204/298.15, 298.23, 204/298.25, 298.26, 298.27, 298.28, 298.29, 298.35; 118/719, 729, 730; 156/345.31, 345.32; 414/217, 222.01, 222.03, 222.07, 222.1, 222.11, 222.12, 223.01, 226.01, 226.02, 222.13

(56) References Cited

U.S. PATENT DOCUMENTS

| | | | | |
|---|---|---|---|---|
| 3,915,117 A | * | 10/1975 | Schertler | 204/298.25 |
| 3,968,885 A | | 7/1976 | Hassan et al. | 414/591 |
| 4,675,096 A | * | 6/1987 | Tateishi et al. | 204/298.25 |
| 4,820,106 A | * | 4/1989 | Walde et al. | 414/217 |
| 4,943,363 A | * | 7/1990 | Zejda et al. | 204/298.25 |
| 5,205,919 A | | 4/1993 | Zejda | 204/298.25 |
| 5,245,736 A | * | 9/1993 | Schertler | 29/33 P |
| 5,549,435 A | * | 8/1996 | Schertler | 414/217 |
| 5,590,994 A | * | 1/1997 | Schertler | 414/217 |
| 6,364,955 B2 | * | 4/2002 | Schertler | 118/719 |

FOREIGN PATENT DOCUMENTS

| | | | |
|---|---|---|---|
| DE | 2445 559 | 4/1975 | |
| DE | 3716498 | 12/1988 | |
| DE | 3912295 | 5/1997 | |
| GB | 2054345 | 2/1981 | |
| JP | 3-109727 | * 5/1991 | 204/298.25 |

* cited by examiner

Primary Examiner—Rodney G. McDonald
(74) Attorney, Agent, or Firm—Crowell & Moring LLP (57) ABSTRACT

A vacuum chamber for transporting at least one workpiece has two or more openings defining respective opening areas for treating or handling the at least one workpiece. A transport device is arranged relative to the openings and includes a drive shaft rotatable around a drive shaft rotational axis. Two or more conveyors transport at least one workpiece. A linear driver is operationally independent to linearly move respective ones of the two or more conveyors relative to the drive shaft, with a drive component in a radial direction relative to the axis. An obstructing member is provided for closing the openings when one of the conveyors is positioned adjacent to the openings by rotating the transport device and is moved by the linear drive towards the opening.

23 Claims, 7 Drawing Sheets

CHAMBER FOR THE TRANSPORT OF WORKPIECES IN A VACUUM ATMOSPHERE, A CHAMBER COMBINATION AND A METHOD FOR TRANSPORTING A WORKPIECE

This application is a continuation of application Ser. No. 09/621,734, filed Jul. 21, 2000 now abandoned; which is a Continuation of Ser. No. 08/131,640 filed Oct. 6, 1993 now abandoned.

The present invention relates to a chamber according to the preamble of claim 1, as well as to a chamber combination comprising such a chamber according to the preamble of claim 2, and a transport method according to the preamble of claim 17.

It is known to transport disk-shaped workpieces, such as storage disks, for example, magnetic storage disks or magneto-optic storage disks, in a chamber by means of a transport device, which can be swivelled about an axis, in alignment with openings of the chamber in order to subject the workpieces, once they are aligned with corresponding openings to a surface treatment, such as a non-reactive or reactive vacuum process, for example, an etching process or a coating process with or without glow discharge support, or in order to transport a workpiece into or out of such an opening. In this case, reference can be made, for example to U.S. Patent Document U.S. Pat. No. 3,856,654, German Patent Documents DE-PS 24 54 544, DE-OS 39 12 295, DE-PS 4 009 603, DE-OS 37 16 498, and European Patent Document EP-A 0 389 820.

In the case of the transport chambers known from the above-mentioned documents, the workpieces are fed by the transport device or from the transport device, in parallel to its axis of rotation, that is, axially, to the chamber openings.

In the case of the design of such a transport chamber, within which, as mentioned above, the workpieces are transported on a transport device rotating about an axis in order to correspondingly be moved axially in predetermined angular positions of the transport device to or from the openings of the chamber, an interaction takes place between the depth of such a chamber measured in the axial direction and the possible axial stroke. The reason is that if the chamber in which the swivellable transport device is provided is to have a flat construction including additional axially arranged aggregates, the possible axial stroke remains low. Analogously, the overall height of such a chamber becomes large if significant stroke paths are to be implemented. In this case, it should be considered that, when the transport device is designed such that as many workpieces as possible are simultaneously transported by means of it in the chamber, this determines only the radial dimension of the chamber, and its axial dimension does not affect the number of workpieces which can be transported simultaneously.

Furthermore, the limitation exists in the case of this design of transport chambers that openings and therefore chambers that can be additionally provided can be provided only opposite the transport path along which the workpieces are transported by means of the swivellable transport device.

It is a first object of the present invention to provide a chamber of the initially mentioned type where these disadvantages are eliminated.

This object is achieved by means of the chamber according to the characterizing part of claim 1.

As a result of the fact that a transport arrangement is provided which, in addition to the swivel motion of the known transport device, can be linearly displaced in a driven manner in parallel to the axis and can also be radially displaced with respect to this axis, it is achieved that, on the one hand, chamber openings must no longer be provided opposite the transport device transport path and that, on the other hand, for the dimenionsing of the required stroke for the servicing of a given additional chamber arranged on the concerned chamber, the also utilized radial stroke according to the invention can be used, the extent of which may be freely selected within wide limits within the scope of the chamber diameter predetermined within by the swivellable transport device.

Based on the above-mentioned known transport chambers, it is a second object of the present invention to be able to build complex overall vacuum treatment facilities by means of such chambers, in which, in a controlled manner, the workpieces, in a freely selectable manner, according to the intended treatment method, can be fed to virtually any number of different treatment stations, in which case the optimal compactness of such facilities is very important.

While, in the case of the initially mentioned known chambers, the number of additional chambers is limited by the dimensioning of the chamber itself, the fact that another transport chamber with at least one additional opening for workpieces is arranged on the chamber combination according to the invention on one of the openings of the concerned chamber, results in the advantage that, starting from the concerned chamber with the swivellable transport device, the workpieces can be transported farther in a widely branched manner and respective treatment chambers may be arranged along the overall transport path.

Preferably, the chamber combination according to the invention is implemented according to claim 3 by the fact that a chamber is provided as the above-mentioned chamber with the swivellable transport device which also has the characteristics of the characterizing part of claim 1.

In the case of the initially mentioned chamber according to the invention or in the case of the chamber combination according to the invention, a high compactness is achieved by means of the approach according to claim 4. This is achieved because of the fact that the drive for the axial linear displacement of the transport arrangement is arranged on the transport device which can be swivelled about the axis in an angular alignment with the openings; that is, the transport device, the drive and the transport arrangement are integrated to form an aggregate.

According to claim 5, it is also preferred to implement, on the chamber according to the invention as well as on the chamber combination according to the invention, the axially displaceable transport arrangement by at least one arm which is parallel to the axis and is offset with respect to the axis of rotation of the transport device, and on which at least one end has a preferably plate-type workpiece holding device.

If the spatial arrangement of the transport device, which can be rotated about the above-mentioned axis, is considered, and then the providing of the arm which is in parallel to the axis and offset with respect to the axis is considered, whereby an L-shaped structure is formed in the axial cross-section, it is easily demonstrated that this structure may be expanded to a T-type structure in that not only one end of such an arm is utilized for the holding of the workpieces but both ends, which further increases the constructional flexibility for the arranging of additional chambers on the chamber according to the invention or on the chamber combination according to the invention. This takes place according to claim 6.

Furthermore, naturally, instead of plate-type workpiece holding devices which are suitable particularly for the holding of disk-shaped workpieces, other, for example, workpiece holding devices in the shape of tongs may be provided, particularly also adapted to the physical design of the workpieces to be treated.

By means of the arrangement of the chamber or chamber combination opening according to claims 7 and/or 8, a high flexibility of the combination is permitted as far as the combination of the mentioned chamber or chamber combination with additional chambers is concerned, as well as their compact spatial composition.

Irrespective of whether a chamber according to the invention with an axially and radially displaceable transport arrangement is considered or, on a chamber combination according to the invention, a transport arrangement with an at first only axially displaceable transport arrangement, it is suggested according to claim 9 to utilize the axial movement of the transport arrangement for the closing-off of the serviced opening, specifically according to the required separation of atmospheres of the chamber connected by the concerned opening and ranging to its vacuum-tight closing-off.

When an also radially displaceable transport arrangement is provided on the chamber or chamber combination according to the invention, an approach according to claim 10 is further suggested, analogously to the statements concerning claim 9.

Additional preferred embodiments of the chamber and chamber combination are specified in claims 11 to 16.

Furthermore, the method according to the invention is also used according to the characterizing part of claim 17 for solving the initially mentioned transport problem.

Embodiments of the invention will be explained in the following by means of figures.

Figure 1:
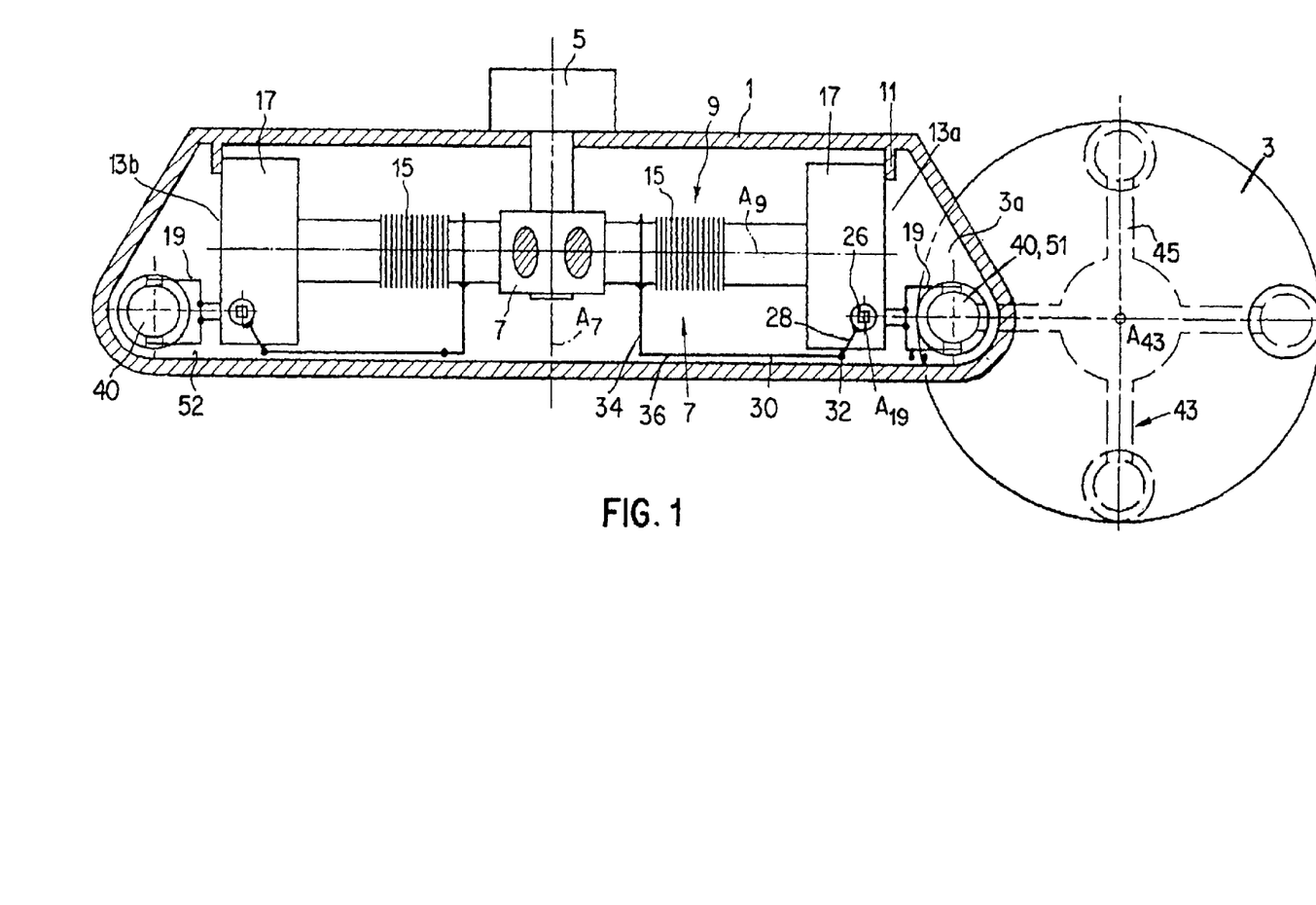
FIG. 1 is a schematic representation of a partially sectional view of a vacuum treatment facility, wherein a chamber according to the invention, a chamber combination according to the invention and the transport method according to the invention are implemented in a preferable manner.
Figure 2:
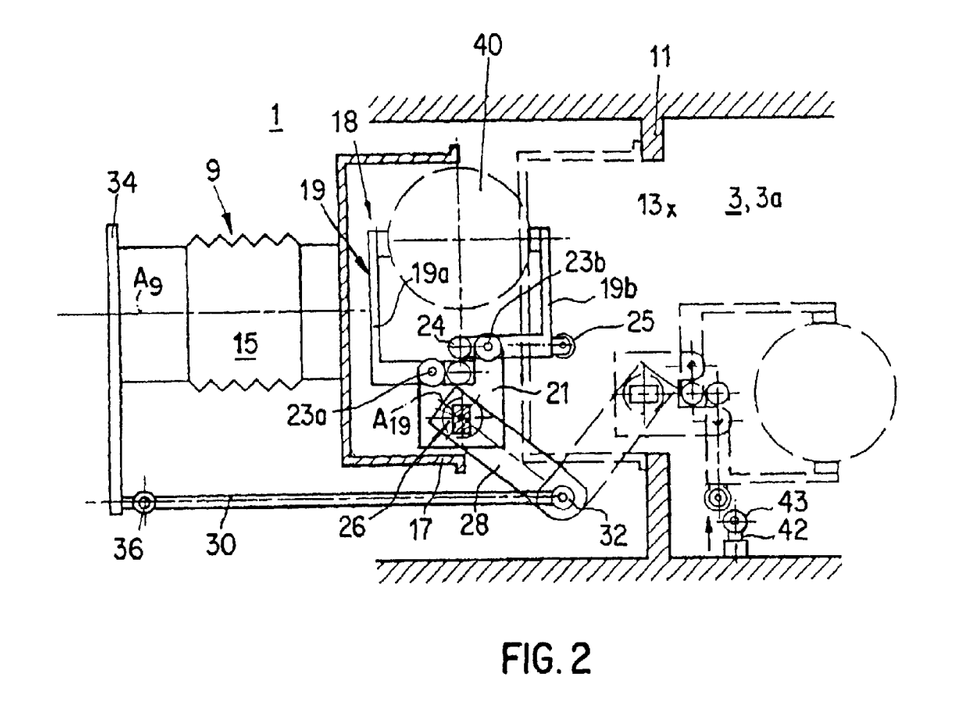
FIG. 2 is an enlarged cut-out of a transfer arrangement on the facility according to FIG. 1.
Figure 3:
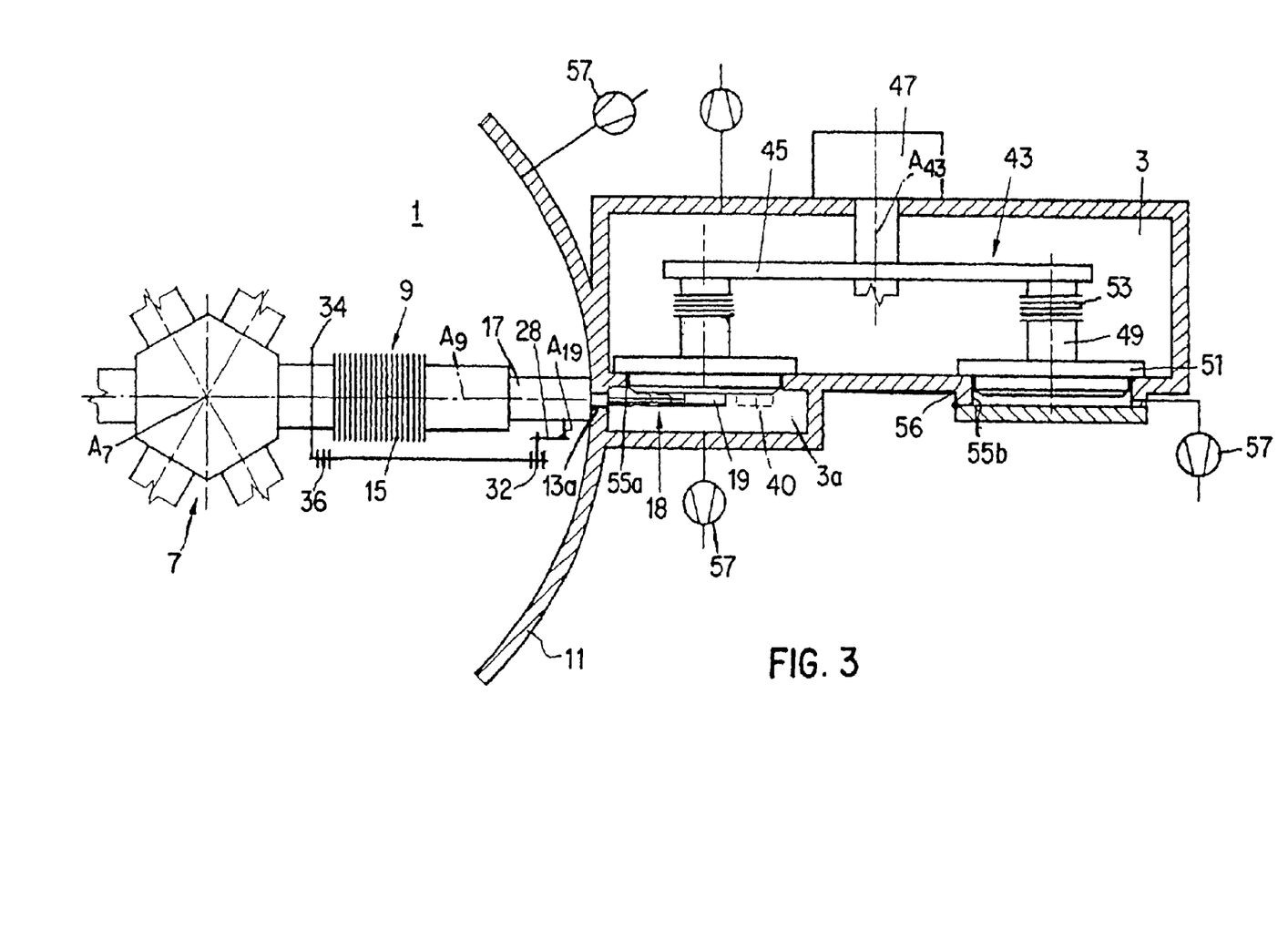
FIG. 3 is a schematic representation of a partially sectional top view of a part of the facility according to claim 1.

FIGS. 1 to 3 are schematic representations of a preferred facility into which the invention is integrated. The facility comprises a chamber 1 and a chamber 3 as well as an intermediate chamber 3a which connects chambers 1 and 3.

A transport star 7, which is controlled in a driven manner by a motor 5 and has six arms 9, as illustrated in the example, is rotationally centrically disposed in the chamber 1. The transport star can be rotated about the axis $A_7$. The exterior wall 11 of the chamber 1 which is parallel to the axis $A_7$ has at least two openings 13a and 13b with which, by means of the rotating of the star 7, the axis $A_9$ of one of the arms 9 respectively is aligned. By means of drives (not shown) integrated on the transport star 7, the arms 9 can be linearly moved out and back radially in the direction of their axes $A_9$. The linear drive is sealed off in a vacuum-tight manner by means of bellows 15. On the end of the arms 9, that is, on the parts of the arms which can be moved radially with respect to the axis $A_7$, one transport bushing 17 respectively is mounted which is illustrated schematically in greater detail in FIG. 2 and which, as indicated by the comparison of FIG. 1 and FIG. 3, is considerably wider in the direction parallel to the axis $A_7$ than in the direction transversely to it, that is, in the azimuthal direction.

Correspondingly, the openings 13a and 13b are designed to be slot-shaped.

Viewed in the direction of the axis $A_7$, a transport device 18 rides in each bushing 7, is disposed so that it can be swivelled about an axis $A_{19}$ and has transport tongs 19 (FIG. 2) which are constructed as illustrated, for example, in FIG. 2. The tongs 19 comprise two tong arms 19a, 19b which are each disposed on a support part 21 so that they can be rotated about swivel axes 23a, b and engage in one another by way of rollers 24 and (not shown) are prestressed in a springy manner into the closed position illustrated in FIG. 2. On tong arm 19b, another actuating roller 25 is provided for the opening and closing release of the tongs.

As mentioned above, the transport device 18, which is formed by the tongs 19 and the support part 21, is swivellably disposed on the bushing 17. On a driving stub 26, which is non-rotatable on the transport device 18, a first lever 28 is non-rotatably disposed which is rotatably disposed on a second lever 30 in a bearing 32. The end of the lever 30, in turn, which faces away from the bearing 32 is rotationally disposed by way of a mounting plate 34 on the radially fixed arm part of the arm 9 on a bearing 36.

The above-described arrangement operates as follows:

Starting from the swivel position of the transport arrangement 18 according to FIG. 2 in a closed position of the tongs, for example, with a workpiece disk 40 in the tongs, the transport star 7 can be swivelled into arbitrary positions about its axis $A_7$. In this case, the bushings 13 are moved back toward the axis $A_7$ by means of the respective radial drives specific to the arms.

When now, as illustrated in FIG. 2, one of the openings, for example 13x, is to be serviced, the axis $A_9$ of one arm 9 and thus the swivel plane of the tongs 19 is aligned with the slot-shaped opening 13x. Now, by means of the drive assigned to the concerned arm 9, the bushing 17 is advanced toward the opening 13x. Because of the resulting linear movement of axis $A_{19}$ with the driving stub 26, the first lever 28 is swivelled about bearing 32; and because the lever 28 is non-rotatably disposed on the stub 26 and the latter is non-rotatable on the transport device 18, as indicated by an interrupted line in FIG. 2, the transport device 18 is swivelled through the opening 13x with the simultaneous linear displacement with the bushing 17. In this case, the bushing 17 rests on the exterior wall 11 of the chamber 1 and closes the opening 13x, according to the requirement of the separation of the two chambers 1 and 3, preferably tightly, if required, vacuum-tightly.

As illustrated in FIG. 2, the bushing 17 remains in the chamber 1, while the workpiece holding device formed by the tongs 19 is swivelled through the opening 13x completely into the chamber 3 or 3a.

Figure 2A:
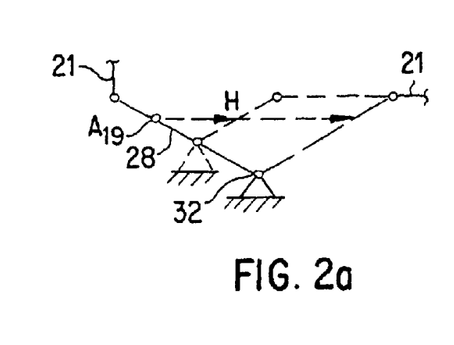

For the required swivel movement of the transport device 18, FIG. 2 illustrates an unnecessarily long linear travel of the bushing 17. However, as a person skilled in the art will immediately see, while also looking at the representation according to FIG. 2a, by means of the reduction of the length of the lever 28 between axis $A_{19}$ and link bearing 32, the same swivel motion of the support part 21 and therefore of the transport device 18 can be implemented by means of a considerably smaller linear travel H.

Thus, by means of a virtually arbitrarily small linear travel H and the corresponding minimalization of the driving and sealing elements to be provided for this purpose, the desired swivel movement can be implemented and, by means of it, as a result of the swivel radius of workpiece 40 about axis $A_{19}$, the desired travel through opening 13x.

As illustrated schematically in FIG. 2, a ram 42 is arranged in chamber 3 or 3a whose roller 43, which is arranged on its end and is controlled by engaging on roller 25 on the tongs 19, opens up the tongs in order to release the workpiece 40.

In the preferred embodiment illustrated in FIGS. 1 to 3, the intermediate lock-type pass-through chamber 3a is provided between chamber 1 and chamber 3. The following description which concerns the chamber 3 will clearly describe the method of operation of the intermediate lock-type pass-through chamber 3a.

As illustrated particularly in FIG. 3, the chamber 3 comprises a transport star 43 with radial arms 45 which are rotationally driven about the axis $A_{43}$ by means of the motor 47 and on which, in parallel to the axis $A_{43}$, as illustrated, for example, four axial arms 49 project upward. On their ends, the arms 49 carry the transport plates 51 with (not shown), for example, mechanical, pneumatic or magnetic holding devices for workpieces, unless the axis $A_{43}$ is perpendicular. The plates 51 can be moved out and back linearly and in parallel to the axis $A_{43}$ by means of the arms 49 of drives sealed off by respective assigned bellows 53.

As illustrated, the chamber 3 has, for example, two openings 55a and 55b aligned with the circular ring through which the plates 51 pass during the rotation about the axis $A_{43}$. The plates 51 are constructed such that they move out toward a respective opening 55, close off the opening by means of sealing elements (not shown) in a tight or vacuum-tight manner. As, on the bushings 17 to the wall 11 of chamber 1, gap sealing devices may be sufficient for this purpose, unless a vacuum-tight sealing is required. Furthermore, the plates 51 project axially beyond the bordering parts 56 of the opening 55 out of the chamber 3, against which the plates 51 are placed in a sealing manner in the moved-out condition.

The conditions at the opening 55a which communicates with the opening 13a by way of the intermediate lock-type pass-through chamber 3a will be described in the following. After, according to FIG. 3, a disk-shaped workpiece 40 has been swivelled by means of the transport device 18 into the position illustrated by an interrupted line in FIG. 2, the bushing 17 is placed to the required extent in a sealing manner against the bordering of the opening 13a on the side of the chamber 1. By means of the controlled axial moving-out of the arm 49 in chamber 3 which will then be assigned to the opening 55a, the plate 51 is placed to the required extent tightly against the bordering 56 of the opening and takes over, for example, magnetically, pneumatically, mechanically or driven by the force of gravity, the workpiece 40 which is released by the tongs 19 by the actuating of the ram 42 according to FIG. 2. The respective arm 49 can now be moved back.

As illustrated schematically at reference number 57, the chamber 3a as well as the chamber 1 and/or 3 may be pumped separately.

The workpiece transport through the intermediate lock-type pass-through chamber 3a will therefore take place as follows:

To the required extent, tight sealing-off of the opening 13a by the bushing 17-tongs 19 empty; swivelling of an arm 49 with the workpiece on the plate 51 in the opening range of the opening 55a; axial advancing of the plate 5 with the workpiece 40 and, to the required extent, tight sealing-off of the opening 55a by plate 51; if necessary, pumping-out of the intermediate lock-type pass-through chamber 3a; taking-over of the workpiece by the tongs; swivelling-back of the transport device 18 with the simultaneous detaching of the bushing 17 from the bordering of the opening 13x; or to the required extent, the empty plate 51 tightly seals off the opening 55a; swivelling-in of an arm 9 with the bushing 17 and the workpiece 40 on tongs 19 by way of opening 13a; swivelling-out of tongs 19 with the workpiece with a simultaneous tight sealing-off, to the required extent, of the opening 13a by means of bushing 17; taking-over of the workpiece magnetically pneumatically, mechanically or driven by the force of gravity, by plate 51 in opening 55a; pumping-out of intermediate lock-type pass-through chamber 3a by means of pump 57; moving-back of plate 51 and continued rotation of the transport star 43.

This description illustrates clearly that the chamber 3a may operate as an intermediate lock-type pass-through chamber which can be pumped separately or which, because of its very low volume, by itself ensures a sufficient separation of the atmospheres of chambers 1 and 3. If no intermediate lock-type pass-through chamber 3a must be provided, the taking-over of the workpiece in the illustrated manner can take place directly in chamber 3 and the plates 51 would not exercise any sealing function at the transfer opening. In the illustrated embodiment, at the transfer connection 13a, 55a, the plate 51 acts as one lock-type pass-through valve and the bushing 17 acts as the other.

In the case of the illustrated preferred embodiment, the opening 55b is also constructed as a feeding/delivery pass-through lock. For this purpose, a cover 57, which can be closed off in a vacuum-tight manner, for example, against the normal atmosphere, is provided as a lock-type pass-through valve, and the plate 51 which is momentarily aligned with the opening 55b acts as the second lock-type pass-through valve.

Despite the extremely small volume of also this lock-type pass-through chamber, as illustrated at reference number 57, if necessary, a pump 57 may also be connected here for the purpose of a separate pumping of this lock-type pass-through chamber.

As mentioned above, the opening 13b of chamber 1 is serviced, as illustrated in FIG. 1, by the bushing 17 and the transport device 18 in the same manner as the above-described opening 13a of the mentioned chamber 1.

Outside chamber 1, for example, a treatment chamber, such as an etching chamber or a coating chamber 52, is arranged on this opening 13b. Because of the fact that the workpiece 40 by means of the tongs 19 is held and swivelled into the treatment chamber 52 in such a manner that it remains uncovered virtually on all sides by the holding device on the tongs, it is possible to treat the workpiece on such a treatment station 52 on all sides, particularly simultaneously on both its disk surfaces, as, for example, by means of the two-sided arranging of electrodes for the plasma etching of both above-mentioned surfaces and/or of magnetron atomization sources for their coating.

Figure 3A:
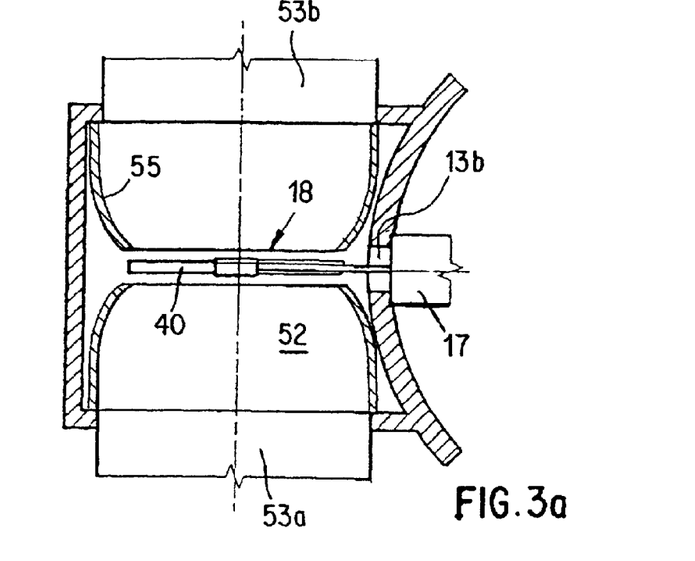
FIG. 3a is a schematic representation of a sectional view according to claim 3 of an etching chamber arranged on the facility according to FIGS. 1 to 3 for the double-sided sputtering of disk-shaped workpieces.

FIG. 3a is a sectional and schematic top view of an embodiment of chamber 52 comprising two sputtering sources 53a and 53b as well as shrouds 55. The disk-shaped workpiece 40 is swung between sources 53a and b and is treated on both sides by sources 53a, b.

At a chamber of this type, a simultaneous two-sided coating of workpieces, for example, may also be carried out, as known from German Patent Document DE-PS 39 31 713.

In the following, the principles of various chamber types will now be discussed, in the case of which all transported workpieces are rotated about an axis of rotation which is offset with respect to the workpieces. Furthermore, a differentiation between cases is carried out, specifically as to whether the workpieces may in addition be displaced in the radial direction, in the axial direction or combined, into the radial and axial direction.

1. Rotary transport chamber, on which workpieces are rotationally transported individually and are displaced radially with respect to the axis of rotation:

Such a chamber is formed by chamber 1 according to FIG. 1, on which the workpieces 40, particularly by means of the linear drive of the arms 9, are individually displaced radially toward the openings 13.

2. Rotary transport chambers, in which all workpieces are arranged on a rotating carrousel and are individually displaced radially with respect to the axis of rotation of the carrousel.

Figure 4:
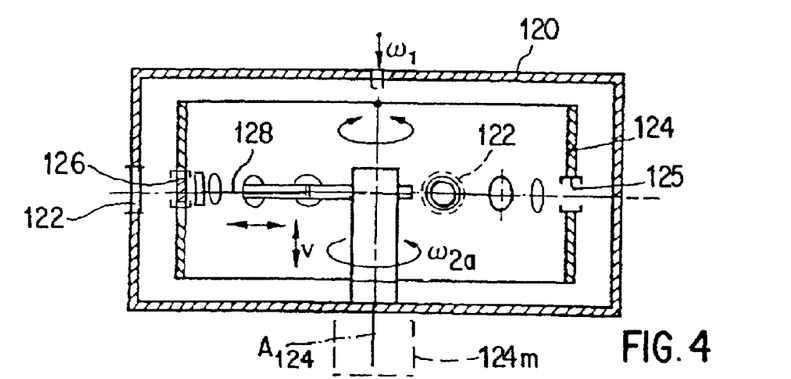
FIG. 4 is a schematic representation of a partially longitudinal sectional view of a carrousel transport chamber with radially serviced chamber openings, as a possible chamber on a chamber combination according to the invention.
Figure 5:
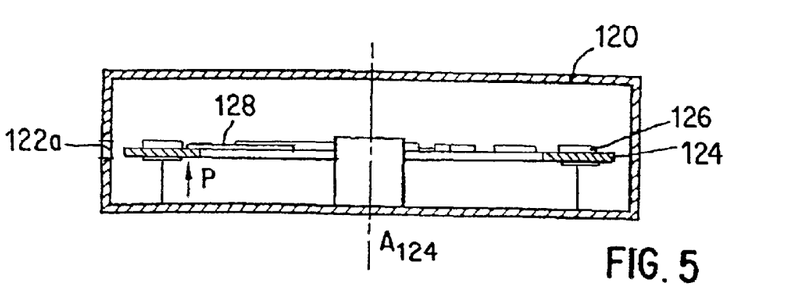
FIG. 5 is a representation that is analogous to that of FIG. 4 of another embodiment of a carrousel chamber with radially serviced chamber openings, as a possible chamber on a chamber combination according to the invention.

A chamber of this type is illustrated schematically in FIGS. 4 and 5. In chamber 120, a carrousel 124 is disposed corresponding to $_1$ so that it can be rotated about an axis $A_{124}$ in a driven manner, workpieces, for example, disk-shaped workpieces 126 of the above-mentioned type, being disposed on the carrousel 124 in holding devices 125. Coaxially with respect to the shaft $A_{124}$, at least one ram 128, disposed in a non-rotatable manner with respect to the chamber 120, is aligned with an opening 122 in the chamber 120 and can be radially displaced with respect to the axis $A_{124}$. By means of this ram 128, a workpiece 126 which, by means of the carrousel, is in each case aligned with one of the openings 122 to be serviced, is pushed out of opening 122 or is moved back onto the carrousel 124 through opening 122. If necessary, the radially displaceable ram or rams 128, as illustrated at $_{2a}$, may be rotationally driven, independently of the carrousel 124, by means of a separate rotary drive $124_m$ indicated by an interrupted line.

In the embodiment which is schematically illustrated in FIG. 5, the carrousel 124 carries the disk-shaped workpieces 126 so that their disk surfaces are rotationally conveyed in planes perpendicularly to the axis of rotation $A_{124}$. The rams 128 are constructed correspondingly and, analogously to the embodiments of FIG. 4, are non-rotatably or independently of the carrousel 124 disposed in the chamber 120 in a rotationally driven manner. In this case, they service radially slot-shaped openings 122a of the chamber 120. The drive of the carrousel 124 may, for example, as illustrated schematically at P, take place in this case peripherally on the edge of the carrousel 124.

3. Rotary transport chambers, in which the workpieces are, on the one hand, rotationally transported about an axis offset with respect to the workpieces, and furthermore are transported individually in the direction in parallel to the axis of rotation.

A chamber of this type is formed by chamber 3 of FIG. 1. In it, the workpieces are axially moved in parallel to the axis of rotation $A_{43}$ by means of the arms 49 which can be moved out and back axially.

4. Rotary transport chambers, in which an axial workpiece movement, as in the case of the chambers of type 3, also takes place but, in addition, a significantly higher number of workpieces are rotationally conveyed on a carrousel than axial-displacement elements are provided for the workpieces.

Figure 6:
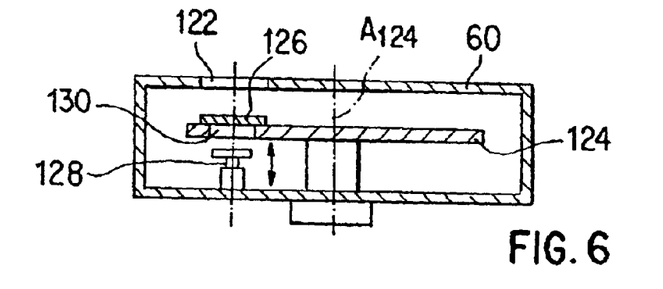
FIG. 6 is a representation analogous to FIG. 4 of a carrousel chamber with axially serviced chamber openings, as a possible chamber on a chamber combination according to the invention.
Figure 7:
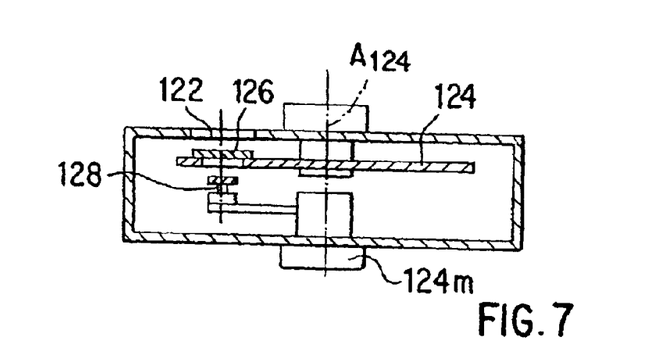
FIG. 7 is a view of another embodiment of the chamber according to FIG. 6.

According to FIGS. 6 and 7, such a chamber 60 has a carrousel 124 which is disposed with respect to the axis of rotation $A_{124}$ in a rotationally driven manner, on which, for example, disk-shaped workpieces 126 are disposed by means of their disk surfaces in the plane of rotation about the axis $A_{124}$. A ram 128, which is aligned with at least one opening 122 on the chamber 60 and can be moved out and back in parallel to the axis $A_{124}$, is fixedly mounted on the housing of chamber 60 and, when the workpiece 126 is rotationally aligned with the opening 122, reaches through a servicing opening 130 on the carrousel 124 and lifts, axially with respect to the axis $A_{124}$, the workpiece 126 toward the opening 122 and moves such a workpiece 126 back from the opening 122 onto the carrousel 124.

While in FIG. 6 the ram or rams 128, as mentioned above, are stationarily mounted on the housing of the chamber 60, according to FIG. 7 and analogously to an embodiment of FIG. 4, they are rotatably in a driven manner with respect to axis $A_{124}$ by means of a separate rotary drive $124_m$, independently of the rotating movement of the carrousel 124 above the same axis. In the case of another embodiment of this type of chamber, the axial travel can be carried out by the carrousel itself.

5. Rotary transport chambers of this type in which the workpieces are rotationally moved about an axis of rotation and are, in addition, in each case, individually displaced axially with respect to this axis and, in addition, with respect to the above-mentioned axis, are each also individually displaced radially. Such a chamber is formed by chamber 1 of FIGS. 1 and 3, together with the transport device 18. On the one hand, workpieces are rotated about the axis $A_{43}$, are in addition, moved axially by means of the axial linear drive of the arms 49, and are also radially displaced by means of the effect of the transport device 18 with respect to the axis $A_{43}$. In particular, in the case of the latter chamber, where the workpieces are displaced axially as well as radially with respect to the above-mentioned axis of rotation, thus in a plane which contains the axis of rotation, such as $A_{124}$, the providing of a swivel transport device is particularly appropriate as implemented by the transport device 18 in the embodiment according to FIGS. 1 to 3.

Naturally, the implementation of a radial and axial workpiece transport with respect to the above-mentioned axis of rotation can also be implemented on a carrousel construction, although it requires higher constructional expenditures.

In the following, it will now be explained by means of FIG. 8 how these chamber types may be combined to form chamber combinations with at least two chambers in order to demonstrate the flexible manner in which such chambers may be combined for the construction of whole vacuum treatment facilities. If necessary, additional types of chambers may be added for the construction of whole facilities, to the above-mentioned chamber types which all have in common that the workpieces are rotationally transported about an axis of rotation in the chamber.

In order to be able to briefly refer to the respective chamber types, the following definitions will be used:

a) EASK: Lock-type pass-through chambers by means of which workpieces may be transported through in both directions.

b) ESK: Lock-type pass-through chambers at which workpieces are passed through only in one direction.

c) BEAK: Treatment chambers in which workpieces are surface-treated, for example, etched or coated.

d) RADK: Radially servicing rotary star chambers of type 1, as illustrated in FIGS. 1 to 3 by chamber 1.

e) RAKAK: Radially servicing carrousel chamber of type 2, as schematically illustrated in FIGS. 4 and 5.

f) AXDK: Axially servicing rotary star chambers of type 3, as illustrated by chamber 3 in FIGS. 1 to 3.

g) AXKAK: Axially servicing carrousel chambers of type 4, as schematically illustrated in FIGS. 6 and 7.

h) AXRADK: Rotary star chambers, which permit an axial as well as a radial servicing, of type 5, as illustrated by chamber 3 with the device in FIGS. 1 to 3.

i) TR: Additional transport chambers with two chamber openings, between which workpieces are transported in any manner, for example, a known manner.

Figure 8A:
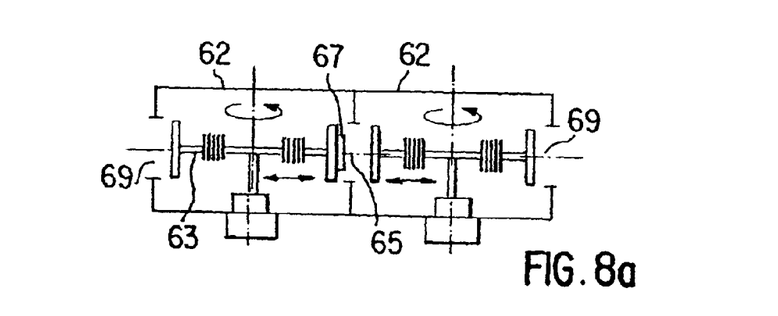
FIGS. 8a to 8f are views of combinations of different chamber types in a minimal configuration for the construction of compact vacuum treatment facilities, in which case variants c), d), e), f) show combinations according to the invention, and variant e) also contains a chamber according to the invention.

In FIG. 8a, two RADK-chamber 62 are combined, comprising one rotationally driven, at least one-armed radially servicing rotary star 63 respectively, by means of which, on the one hand, the connection opening 65 between the two chambers 62 is serviced with workpieces 67 and, on the other hand, additional openings 69 are serviced on which any additional chambers of types a) to i) may be arranged.

In this configuration, the axes of rotation of the transport stars 63 are in parallel and, with respect to the illustrated two chambers 62, the transport takes place essentially in a plane perpendicularly to the above-mentioned axes of rotation.

According to the requirements, by means of the radially displaceable rotary star arms, the openings 65 and 69, which are serviced by them, may be closed in a tight or vacuum-tight manner.

Figure 8B:
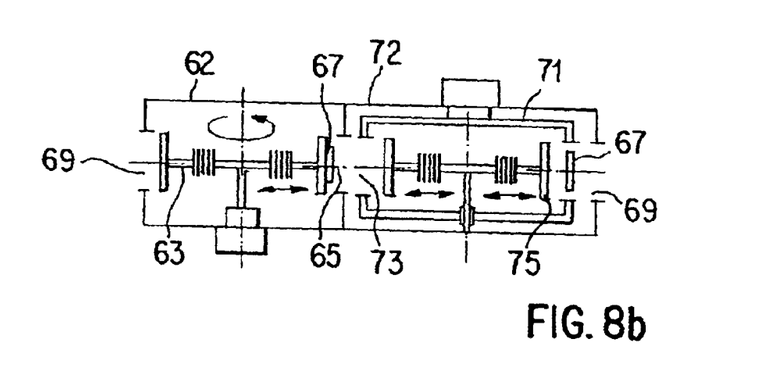

According to FIG. 8b, a radially servicing rotary star chamber 62 RADK interacts with a radially servicing RAKAK carrousel chamber. This carrousel chamber has a carrousel 71 which is rotationally driven about an axis, has receiving devices 73 for the workpieces 67, and services, on the one hand, the common opening 65 and, on the other hand, at least one additional opening 69. In the RAKAK chamber 72, in the shown example, radially displaceable rams 75 are provided in a non-rotatable manner which convey and return workpieces 67 from and to the receiving devices 73 on the carrousel to and from the respective openings 65, 69. Here also, the workpieces are conveyed in a plane that is perpendicular to the axes of rotation of the rotary star 63 or the carrousel 71. According to the requirements, the openings 69 and 65 are tightly or vacuum-tightly closed off by the effect of the arms of the rotary star 63 or by that of the rams 75. In this case also, additional chambers of types a) to i) may also be arranged on the openings 69.

It is now easily recognizable that a rotary star chamber 62 according to FIG. 8b may be replaced by a second radially servicing carrousel chamber RAKAK 72, whereby a chamber combination is formed of two RAKAK chambers, analogously to the configuration illustrated in FIG. 8a for rotary star chambers.

Figure 8C:
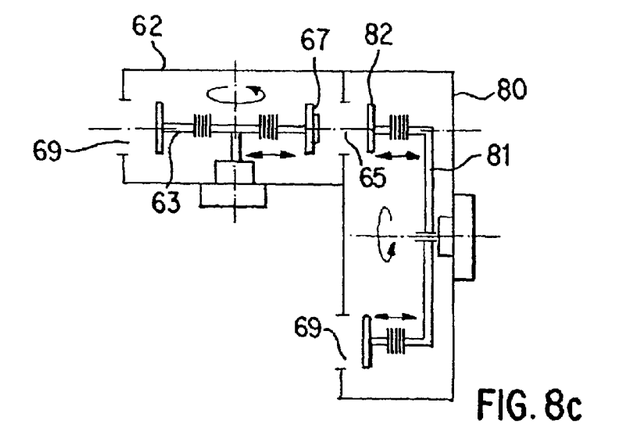

In FIG. 8c, a radially servicing rotary star chamber RADK 62 is combined with an axially servicing rotary star chamber AXDK 80. The latter has a rotary star 81, on which rams 82 are arranged which are displaceable in an axially driven manner. By means of the radially displaceable arms of the rotary star 63 and the axially displaceable rams 82 on the rotary star 81, the chamber opening 65 is serviced; by means of the corresponding rotary starts 63 and 81, additional openings 69 on chambers 80 and 62 may be serviced on which additional chambers of types a) to i) may be mounted. As illustrated, a workpiece transport is implemented here in two planes which are perpendicular with respect to one another. According to the requirements, the arms of the rotary star 63 as well as the rams of the rotary star 81 may tightly, if necessary, vacuum-tightly, close off the opening 65 and the openings 69.

It is self-evident that in FIG. 8c, instead of a radially acting rotary star chamber RADK 62, an identically acting carrousel chamber RAKAK 72 may be arranged.

Figure 8D:
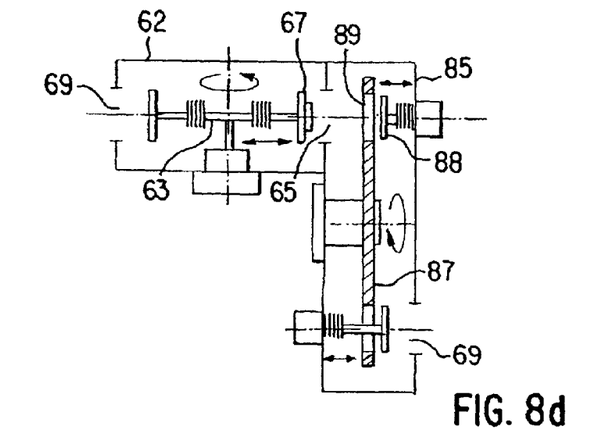

Instead of the axially acting rotary star chambers AXDK 80 of FIG. 8c, in FIG. 8d, an axially acting carrousel chamber AXKAK 85 is provided. It comprises a, for example, disk-shaped carrousel 87 with workpiece receiving devices 89. Axially displaceable rams 88, which are aligned with the opening 65 and the openings 69, lift the workpieces in the workpiece holding devices 89 out of the carrousel to the above-mentioned openings and return them into the holding devices 89. In this case also, the workpiece transport takes place in two perpendicular planes. The arms of the rotary star 63 and the rams 88 may, according to the requirements, close off the openings 65 and 69 in a tight or vacuum-tight manner. Also in this case, additional chambers of types a) to i) may be connected to the openings 69.

Figure 8E:
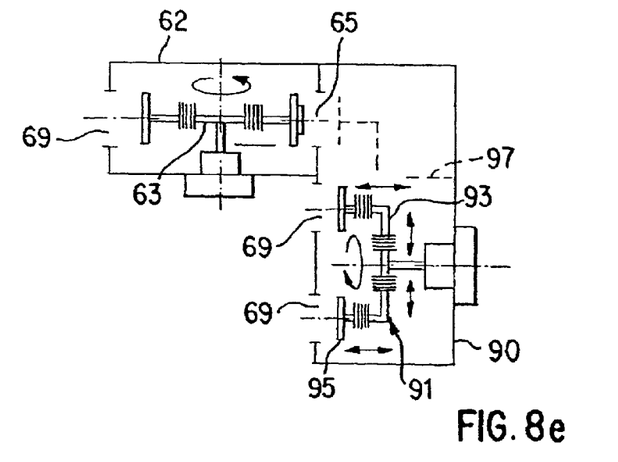

It is easily recognizable in FIG. 8e that the radially acting rotary star chamber RADK 62 may be replaced by a radially acting carrousel chamber RAKAK 72 according to FIG. 8b.

FIG. 8e represents a configuration which consists of a radially acting rotary star chamber RADK 62 and an axially and radially acting rotary star chamber AXRADK 90. The latter has a rotary star 91 which, on one side, comprises arms 93 which can be moved out radially, on which rams 95 are disposed which can be moved out and returned axially.

When this embodiment is compared with that of FIG. 8c, where only axially displaceable rams 82 are provided, a significant advantage of the configuration according to FIG. 8e is illustrated. While chamber 80 of FIG. 8c in its diameter must be dimensioned with respect to the axis of rotation of the star 81, specifically such that the opening 65 can be serviced by an axial displacement of the rams 82, in the case of the embodiment according to FIG. 8e, the diameter of the chamber 90 with respect to the axis of rotation of the star 91 may be selected to by only so large that the openings 69 can be serviced. Only in, for example, one rotating position of the rotary star 61, the corresponding arm 93 can be moved out radially in order to service opening 65 by means of a subsequent axial displacement. As indicated by an interrupted line at reference number 97, this results in the possibility of servicing the opening 65 by way of an intermediate chamber which lets the diameter of the chamber 90 with respect to the axis of rotation of the star 91 project out, as mentioned above, only in an angular position.

With respect to the tight closing-off of the openings 69 and 65, statements concerning FIGS. 8a to d will also apply here. Furthermore, it is stressed that the implementation of the axial and radial transport displacements on chamber 90 is also possible in different variants, thus also by the inclusion of additional transport devices, as implemented, for example and preferably, by means of the swivel transport device 18 in the embodiment according to FIGS. 1 to 3.

It is easily recognizable that in the embodiment according to FIG. 8e, instead of a radially acting turntable chamber RADK 62, a radially acting carrousel chamber RAKAK 72 according to FIG. 8b may be provided.

Figure 8F:
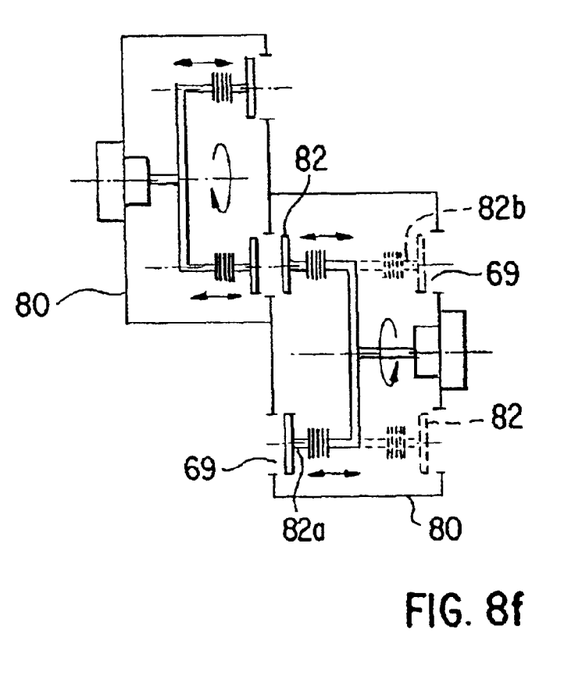

FIG. 8f illustrates the combination of two axially servicing rotary star chambers AXDK 80. The method of operation is easily recognizable. It is also illustrated by an interrupted line that axially displaceable rams 82 may be arranged in pairs 82a and 82b so that by means of such rams and by means of the same rotary star, openings 69 may be serviced which are arranged on two sides of the plane of rotation. The same technique may naturally also be implemented according to FIG. 8e for rotary stars AXRADK with a radial and axial advance.

As easily recognizable, it is possible without any problems to provide on the arrangement according to FIG. 8f, instead of one of the AXDK chambers 80, an AXRADK chamber 85 according to FIG. 8d. It is also demonstrated that the coupling of two AXKAK chambers according to chamber 85 of FIG. 8d is easily possible. It is also easily possible to provide a chamber AXRADK 90 according to FIG. 8e on an AXDK chamber 80 according to, for example, FIG. 8c. Also possible is the combination of an AXKAK chamber 85 according to FIG. 8d with an AXRADK chamber 90 according to FIG. 8e.

If, in the case of the above-mentioned and described chamber combinations, the individual chambers are each to be conditioned separately, it is self-evident that respective pump connections and, if required, gas inlets, will be provided leading to the respective individual chambers.

By means of the described chamber combinations, extremely compact overall facilities may also be combined in a modular manner, with an optimally short transport path and short transport cycles.

The described approach and the described facility are particularly suitable for the treatment of magnetic storage disks, such as CD's or hard disks.

What is claimed is:

1. A vacuum chamber for transporting at least one workpiece, comprising
   at least two openings defining respective opening areas for one of treating and of handling said at least one workpiece thereat; and a transport device operatively arranged relative to the at least two openings and including
   at least one linear driver, a drive shaft rotatable around a rotational axis of said drive shaft, and at least two conveyors for transporting at least one workpiece each operatively, said at least one linear driver being operationally independent to linearly move respective ones of said at least two conveyors relative to said drive shaft and with a drive component in a radial direction relative to the axis, and
   an obstructing member for closing said openings when one of said at least two conveyors is positioned adjacent to said openings by rotating said transport device and is moved by said at least one linear driver towards said opening, said member being operationally coupled to said one conveyor.

2. The chamber of claim 1, wherein said at least one linear driver is arranged to act at least in one of a radial direction and a parallel direction with respect to said rotational axis of said drive shaft on respective ones of said at least two conveyors.

3. The chamber of claim 1, each of said at least two conveyors comprising a linear radial drive relative to the axis and a linear axial drive relative to the axis configured to be operationally independent.

4. The chamber of claim 1, wherein said at least two openings define an opening area each with normals on said opening areas being angularly disposed with respect to said rotational axis.

5. The chamber of claim 1, wherein said at least two conveyors are arranged to be positioned adjacent one of said openings upon rotation of said transport device and are movable by said at least one linear drive towards and from said one opening in a normal direction to said opening areas.

6. The chamber of claim 1, further comprising at least one of a load-lock chamber and of a station for treating said workpiece communicating via said openings with said chamber.

7. The chamber of claim 1, wherein said obstructing member is formed by a conveyor plate for said workpiece of said one conveyor.

8. The chamber of claim 7, further comprising holding means for said workpiece on said conveyor plate.

9. The chamber of claim 1, wherein said at least one linear driver of each of said at least two conveyors comprises at least one drivingly expandable and retractable arm.

10. The chamber of claim 1, wherein said at least one linear driver is arranged remote from said axis and is configured to drive the respective conveyors parallel to said rotational axis.

11. The chamber of claim 10, wherein said at least one linear driver comprises two linear drives arranged remote from said rotational axis and drive respective conveyors parallel to said rotational axis, said respective conveyors having a workpiece support area each facing in mutually opposite axial direction.

12. The chamber of claim 10, wherein said at least one linear drive comprises an extendable and retractable arm.

13. The chamber of claim 1, wherein at least one of the openings defines a normal on an opening area thereof which is parallel to said rotational axis.

14. The chamber of claim 1, wherein at least one of the openings defines a normal on its opening area in a radial direction with respect to said rotational axis.

15. The chamber of claim 1, wherein said obstructing member is a sealing member.

16. A chamber arrangement comprising a first chamber with
   at least two openings defining respective opening areas for one of treating and of handling said at least one workpiece thereat;
   a first transport device comprising
      a drive shaft rotatable around a rotational axis of said drive shaft;
      at least two conveyors arranged at said transport device for transporting at least one workpiece each, said transport device comprising at least one linear driver for each of said at least two conveyors, said at least one linear driver being operatively coupled between said drive shaft and said conveyors and being operable independently of each other to linearly move the conveyors relative to said shaft;
   and a second chamber mounted to one of said at least two openings of said first chamber, said second chamber comprising a second transport device with at least one conveyor for at least one workpiece, said conveyor of said second transport device being linearly movable in a direction tangentially with respect to rotational movement of said rotatable drive shaft.

17. The chamber arrangement of claim 16, further comprising a handling device acting through said one opening to convey at least one workpiece between a conveyor of said first transport device and the conveyor of said second transport device.

18. The chamber arrangement of claim 16, wherein said second transport device is swivelably mounted in said second chamber around a second rotational axis, said second rotational axis of said second transport device being disposed perpendicularly to said rotational axis of said first transport device.

19. The chamber arrangement of claim 16, wherein said second transport device comprises at least one arm carrying said conveyor of said second transport device, said arm of said second transport device extending parallel to and remote from said rotational axis of said second transport device.

20. The chamber arrangement of claim 19, wherein said arm of said second transport device is drivingly expandable and retractable.

21. The chamber arrangement of claim 17, wherein said handling device is mounted to at least one of said first and of said second transport device.

22. The chamber arrangement of claim 21, wherein said handling device comprises a pivotable arm, pivotably connected to one of said first and of said second transport devices and carrying one of said conveyors at its pivotable end, whereby said pivotable arm is of such an extent that said conveyor mounted thereto is swivelable through said opening.

23. A vacuum chamber for the transport of at least one workpiece, comprising at least two workpiece handling openings in a wall thereof, a transport device mounted within the chamber and selectively swivellable around an axis into angular alignment with the workpiece handling openings, and at least one workpiece support for at least one workpiece being selectively movable parallel to the axis and radially with respect to the axis via independent drives mounted to the transport device so as to independently move said at least one workpiece support one of radially only parallel to the axis and both radially and parallel to the axis.

* * * * *